US009537461B2

(12) United States Patent
Boutayeb et al.

(10) Patent No.: US 9,537,461 B2
(45) Date of Patent: Jan. 3, 2017

(54) SYSTEM AND METHOD FOR ELECTRONICALLY ADJUSTABLE ANTENNA

(71) Applicants: Halim Boutayeb, Montreal (CA); Vahid Miraftab, Kanata (CA)

(72) Inventors: Halim Boutayeb, Montreal (CA); Vahid Miraftab, Kanata (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/555,646

(22) Filed: Nov. 27, 2014

(65) Prior Publication Data

US 2016/0156325 A1    Jun. 2, 2016

(51) Int. Cl.
| | |
|---|---|
| *H01Q 3/00* | (2006.01) |
| *H01Q 3/26* | (2006.01) |
| *H04M 1/00* | (2006.01) |
| *H01P 1/201* | (2006.01) |
| *H03H 7/01* | (2006.01) |
| *H01Q 1/50* | (2006.01) |

(Continued)

(52) U.S. Cl.
CPC ............ *H03H 7/0115* (2013.01); *H01P 1/208* (2013.01); *H01Q 1/2291* (2013.01); *H01Q 1/50* (2013.01); *H01Q 3/24* (2013.01); *H01Q 3/446* (2013.01); *H01Q 13/00* (2013.01); *H01Q 21/0031* (2013.01); *H03H 7/0138* (2013.01); *H03H 7/0161* (2013.01)

(58) Field of Classification Search
USPC ...... 343/772, 777, 783; 455/121, 561, 562.1
See application file for complete search history.

(56) References Cited

U.S. PATENT DOCUMENTS

| | | | |
|---|---|---|---|
| 3,852,761 A | 12/1974 | Bogner | |
| 7,068,129 B2 | 6/2006 | Higgins et al. | |

(Continued)

FOREIGN PATENT DOCUMENTS

| | | |
|---|---|---|
| CN | 102694231 | 9/2012 |
| CN | 102832432 | 12/2012 |
| CN | 202797210 | 3/2013 |
| JP | 2000196350 | 7/2000 |

OTHER PUBLICATIONS

International Search Report and Written Opinion received in International Application No. PCT/CN2014/071877 mailed May 13, 2014, 12 pages.

(Continued)

*Primary Examiner* — Blane J Jackson

(57) ABSTRACT

An antenna having a line feed delivering a radiofrequency (RF) signal to or from a radial waveguide is provided. The radial waveguide may include radiating elements on its periphery for converting the RF signal into a wireless signal. Filter elements are disposed within the waveguide, interposed radially between the line feed and the waveguide periphery. The filter elements are controllable for tunably filtering of the RF signal in their vicinity. Portions of the RF signal propagating through the waveguide in different direction may be bandpass filtered differently or blocked, thereby allowing for both beamsteering and bandpass filtering to support multiple frequency bands concurrently. Also provided is a design for the filter elements as tunable filter components of a frequency selective surface.

23 Claims, 12 Drawing Sheets

(51) Int. Cl.
  *H01Q 13/00* (2006.01)
  *H01Q 1/22* (2006.01)
  *H01Q 3/24* (2006.01)
  *H01Q 21/00* (2006.01)
  *H01P 1/208* (2006.01)
  *H01Q 3/44* (2006.01)

(56) References Cited

U.S. PATENT DOCUMENTS

| | | | |
|---|---|---|---|
| 7,636,070 | B2 | 12/2009 | De Lustrac |
| 2003/0117243 | A1 | 6/2003 | Cooper |
| 2003/0151551 | A1 | 8/2003 | Chen et al. |
| 2003/0184476 | A1 | 10/2003 | Sikina et al. |
| 2004/0183624 | A1 | 9/2004 | Liang |
| 2005/0225411 | A1 | 10/2005 | Sauderer et al. |
| 2014/0218237 | A1 | 8/2014 | Boutayeb |
| 2014/0266961 | A1* | 9/2014 | Tavassoli Hozouri .. H01P 1/208 343/850 |
| 2015/0214616 | A1* | 7/2015 | Rogers ................. H01Q 5/321 343/753 |
| 2015/0380814 | A1* | 12/2015 | Boutayeb .............. H01Q 13/00 343/776 |
| 2015/0380815 | A1* | 12/2015 | Boutayeb .............. H01Q 13/00 343/777 |

OTHER PUBLICATIONS

Boutayeb et al. Analysis and Design of a Cylindrical EBG-based Directive Antenna, IEEE Transactions on Antennas and Propagation, vol. 54, No. 1, Jan. 2006, pp. 211-219.

Boutayeb et al. Analysis of Radius-Periodic Cylindrical Structures, IEEE Antennas and Propagation Society International Symposium, vol. 2 Jun. 22-27, 2003, pp. 813-816.

Boutayeb et al. "Etude des Structures Periodiques Planaires et Conformes Associees aux Antennes. Application aux Communcations Mobiles.," Ph.D. Thesis, Presentee Devant L'Universite de Rennes 1, IETR, Group Antennes et Hyperfrequences UMR CNRS 6164, Campus de Beaulieu, Dec. 12. 2003, (with English Abstract) 272 pages.

Boutayeb et al. "Metallic Cylindrical EBG Structures with Defects: Directivity Analysis and Design Optimization," IEEE Transactions on Antennas and Propagation, vol. 55, No. 11, Nov. 2007, pp. 3356-3361.

Boutayeb et al. "A Reconfigurable Electromagnetic Band Gap Structure for a Beam Steering Base Station Antenna," 27th ESA Antenna Technology Workshop on Innovative Periodic Antennas, Jan. 2004, 7 pages.

Boutayeb et al. "Wide-band CEBG-based Directive Antenna," 2007 IEEE Antennas and Propagation Society International Symposium, Jun. 9-15, 2007, pp. 2909-2912.

Boutayeb et al. "Technique for Reducing the Power Supply in Reconfigurable Cylindrical Electromagnetic Band Gap Structures," IEEE Antennas and Wireless Propagation Letters, vol. 5, No. 1, Dec. 2006, pp. 424-425.

International Search Report and Written Opinion received in International Application No. PCT/CN2015/095468 mailed Mar. 1, 2016.

English Abstract of CN 102694231.
English Abstract of CN102832432.
English Abstract of JP2000196350.
English Abstract of CN 202797210.

* cited by examiner

SYSTEM AND METHOD FOR ELECTRONICALLY ADJUSTABLE ANTENNA

CROSS-REFERENCE TO RELATED APPLICATIONS

This is the first application filed for the present invention.

FIELD OF THE INVENTION

The present invention pertains to the field of agile antennas and in particular to a system and method for an electronically adjustable antenna.

BACKGROUND

Agile beam switching antennas are desirable due to their ability to selectively direct radiofrequency energy in desired directions. This can be beneficial for example for enhancing communication and mitigating interference with or caused by the antenna. Frequency agile antennas capable of communicating in different frequency bands are also desirable for example in order to provide integrated communication support over multiple bands. Conventionally, frequency agility and beam switching are implemented into an agile antenna design via separate components, thereby increasing design complexity and cost, and potentially impacting performance. For example, a separate tunable filter is typically required to adjust the operating frequency of a given beam switching antenna.

As a separate background matter, fixed waveguide filters such as iris and post waveguide filters generally include one or more particular conductive structures placed within the waveguide. However, the field of tunable or otherwise adjustable waveguide filters is limited and subject to improvement.

Therefore there is a need for a system and method for an electronically adjustable antenna that is not subject to one or more limitations of the prior art.

This background information is provided to reveal information believed by the applicant to be of possible relevance to the present invention. No admission is necessarily intended, nor should be construed, that any of the preceding information constitutes prior art against the present invention.

SUMMARY

An object of embodiments of the present invention is to provide a system and method for an electronically adjustable antenna. In accordance with embodiments of the present invention, there is provided an antenna having: a line feed, a radial waveguide, and one or more filter elements. The line feed is configured to deliver a radiofrequency (RF) signal to and/or from the radial waveguide. The radial waveguide is coupled to the line feed and configured to propagate the RF signal radially with respect to the line feed. The radial waveguide may comprise a pair of parallel, potentially circular conductive surfaces spaced apart by a predetermined amount and configured for radial propagation of RF energy from the line feed. The one or more filter elements are disposed within a cavity of the radial waveguide and interposed radially between the line feed and a periphery of the radial waveguide. Each one of the filter elements is configured to filter the RF signal in a vicinity of said one of the filter elements. Multiple filter elements in a given region may cooperate to filter the RF signal in that region. Further, frequency characteristics of said filtering of the RF signal are adjustable in accordance with control signals provided to the filter elements. In various embodiments, radiating elements are disposed about the periphery of the radial waveguide and driven by or providing portions of the RF signal propagated by the radial waveguide.

In accordance with embodiments of the present invention, there is provided a method for operating an antenna. The method includes emitting a radiofrequency (RF) signal from or to a line feed. The RF signal is further propagated via a radial waveguide. The antenna includes the line feed and the radial waveguide operatively coupled to the line feed. The line feed is configured to deliver the RF signal to the antenna, from the antenna, or both, and the radial waveguide is configured to propagate the RF signal radially with respect to the line feed. One or more filter elements are disposed within a cavity of the radial waveguide and interposed radially between the line feed and a periphery of the radial waveguide. Further, each one of the filter elements is controllable for filtering of the RF signal in its vicinity. The method further includes providing control signals to the filter elements for adjusting frequency characteristics of said filtering of the RF signal.

In accordance with embodiments of the present invention, there is provided a filter element for use in a waveguide propagating a radiofrequency (RF) signal. The filter element includes a surface having an aperture. The filter element is further configured for disposition within a cavity of the waveguide and for orientation across a direction of propagation of the RF signal. The filter element also includes a controllable element disposed at least partially within the aperture. The controllable element is electrically controllable to adjust an electrical impedance characteristic. Adjustment of the electrical impedance characteristic may facilitate adjusting a filtering effect of the filter element upon the RF signal.

BRIEF DESCRIPTION OF THE FIGURES

Further features and advantages of the present invention will become apparent from the following detailed description, taken in combination with the appended drawings, in which.

It will be noted that throughout the appended drawings, like features are identified by like reference numerals.

DETAILED DESCRIPTION

Definitions

Figure 1:
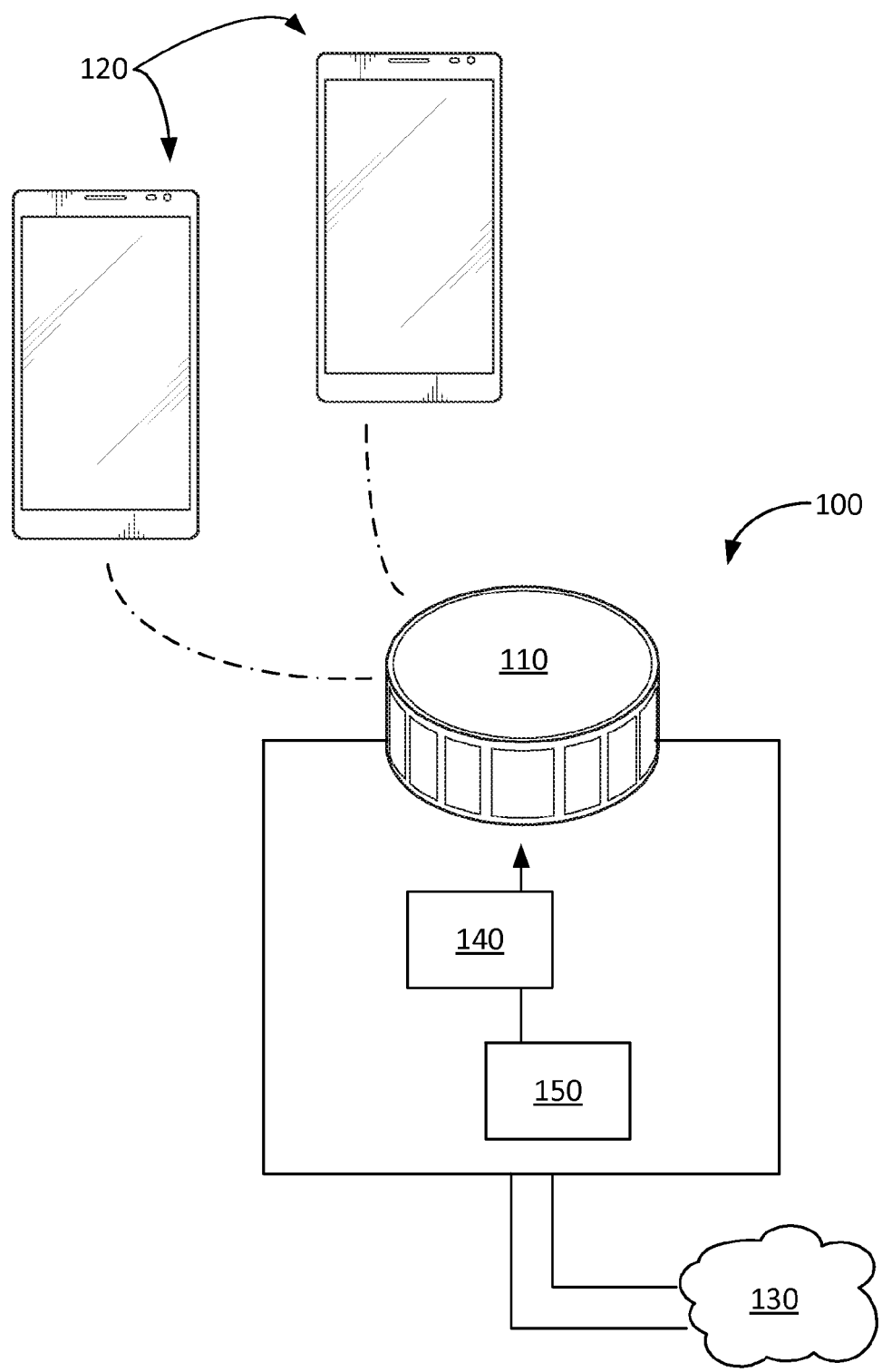
FIG. 1 illustrates a wireless network comprising a radio communication apparatus provided in accordance with embodiments of the present invention.

As used herein, the term "about" should be read as including variation from the nominal value, for example, a +/−10% variation from the nominal value. It is to be understood that such a variation is always included in a given value provided herein, whether or not it is specifically referred to.

Unless defined otherwise, all technical and scientific terms used herein have the same meaning as commonly understood by one of ordinary skill in the art to which this invention belongs.

Embodiments of the present invention provide an antenna having a central line feed, a radial waveguide, and one or more electronically tunable filter elements. The antenna may be electronically adjustable, for example electronically steerable and electronically frequency tunable. The line feed is configured to deliver a radiofrequency (RF) signal to the waveguide or from the waveguide, while the radial waveguide is operatively coupled to the line feed and configured to propagate the RF signal radially with respect to the line feed, for example outwards from the line feed in the case of a transmitting antenna or inwards to the line feed in the case of a receiving antenna. The one or more filter elements are disposed within a cavity of the radial waveguide, and are interposed radially between the line feed and a periphery of the radial waveguide. Each one of the filter elements is controllable for filtering of the RF signal in a vicinity of said one of the filter elements. Furthermore, frequency characteristics of said filtering of the RF signal are adjustable in accordance with control signals provided to the one or more filter elements.

In various embodiments, the filter elements are physically arranged to provide a tunable filtering structure within the waveguide which incorporates periodic boundary conditions. For example, the filter elements may be arranged side-by-side in one or more rings within the radial waveguide, each ring being closed so that every filter element is between two other filter elements in the ring. In various embodiments, the periodic boundary conditions are implemented in a direction which is perpendicular to the local direction of RF signal propagation.

Although various embodiments comprise a plurality of controllable filter elements which may be controlled in cooperation to produce a variety of spatially reconfigurable filtering conditions, other embodiments may comprise a single controllable filter element. For example, the single controllable filter element may be provided along with additional non-controllable filter elements and/or additional filter elements which are controllable such as PIN diodes, all of which may be spatially arranged within the waveguide in a predetermined arrangement. A single controllable filter element may be appropriate for example when only a limited arc of the radial antenna configuration requires control, such as adjustable frequency filtering control and/or wideband blocking/unblocking control.

Embodiments of the present invention provide a method for operating an antenna. The antenna has a line feed configured to deliver a radiofrequency (RF) signal and a radial waveguide operatively coupled to the line feed and configured to propagate the RF signal radially with respect to the line feed. The method includes emitting the RF signal from or to the line feed. At least one and in various embodiments a plurality of filter elements are disposed within a cavity of the radial waveguide and interposed radially between the line feed and a periphery of the radial waveguide. Also, each one of the filter elements is controllable to facilitate filtering of the RF signal in a vicinity of said one of the filter elements. The method further includes providing control signals to the filter elements for adjusting frequency characteristics of said filtering of the RF signal.

Additionally or alternatively, embodiments of the present invention provide a filter element for use in a waveguide propagating a radiofrequency (RF) signal. The filter element includes a surface with an aperture formed within. The filter element is configured for placement in a cavity of the waveguide, where it may be oriented across a direction of propagation of the RF signal. The filter element also includes a controllable element located at least partially within the aperture. The controllable element is electrically controllable to adjust an electrical impedance characteristic, in order to adjust a filtering effect of the filter element upon the RF signal.

Various embodiments of the present invention therefore provide for an antenna incorporating a radial waveguide with included active filter elements which can be adjusted with respect to their filtering effects on RF signals propagating through the waveguide, and radiating elements located around a periphery of the waveguide. Propagation in different regions of the radial waveguide can be filtered differently by different adjustment of the active filter elements in those regions. Filtering in different regions may include blocking one portion of the RF signal while passing another portion, or blocking substantially all of the RF signal within an operating frequency range. Thus, different beams of RF energy, potentially in different frequency bands, may be directed in different directions of the waveguide to and/or from different radiating elements on the waveguide periphery. As such, the filter elements such as described herein may facilitate both frequency agility and radiation pattern agility.

Control of the filter elements and RF signal emission may be facilitated by the use of control signals generated by appropriate analog or digital driver circuitry. Such driver circuitry may in turn be controlled by an appropriate computer, circuit, microcontroller, or the like. Control signals may be varied based on user or operator input, conditions such as scheduling conditions, commands generated by a radio transceiver or base station, or other detected conditions relevant to the radio environment.

Various embodiments of the present invention relate to a radio communication apparatus, such as but not limited to a base station, which incorporates one or more antennas as described herein, along with control circuitry for operating the antenna. The control circuitry may include a source of control signals for adjustably controlling the filter elements, as well as an RF front-end operatively coupled to the waveguide feed for RF signal transmission and/or reception.

FIG. 1 illustrates a wireless network comprising a radio communication apparatus 100 provided in accordance with embodiments of the present invention. The radio communication apparatus 100 comprises an antenna 110 for communicative coupling to a plurality of User Equipments (UEs) 120 within a coverage area. The radio communication apparatus 100 may correspond to a component capable of providing uplink and/or downlink wireless access to the UEs 120, such as a base station, eNB, femtocell, wireless access point, wireless router, or the like. The radio communication apparatus 100 may further be operatively coupled to a backhaul network 130 by wired or wireless connection. The radio communication apparatus 100 may comprise various operatively interconnected electronic components 150 which can include one or more of signal processing components, control components, RF front-end components, microprocessors, microcontrollers, memory (random access memory, flash memory or the like), integrated circuits, and the like. In particular, the radio communication apparatus 100 may include an antenna filter element control module 140 configured to generate and transmit control signals to the antenna 110 which is a radial waveguide antenna having controllable filter elements as described herein. The control signals are routed to the filter elements for controlling filtering aspects thereof, such as filter frequency response.

The control signals may be digital or analog signals, or a combination thereof. For example, at least some of the control signals may correspond to variable voltage levels for driving varactors incorporated into respective controllable filter elements, said voltage levels selected for adjusting capacitances associated with the varactors to desired levels. The antenna filter element control module 140 may comprise various electronic components such as a microprocessor, control circuit, or the like, for selecting a desired set of control signals at a desired time for providing desired frequency response and beamsteering pattern characteristics of the antenna, as well as signal drivers and intermediate circuitry for transmitting the appropriate control signals to the appropriate filter elements.

Radial Waveguide Antenna

Figure 2:
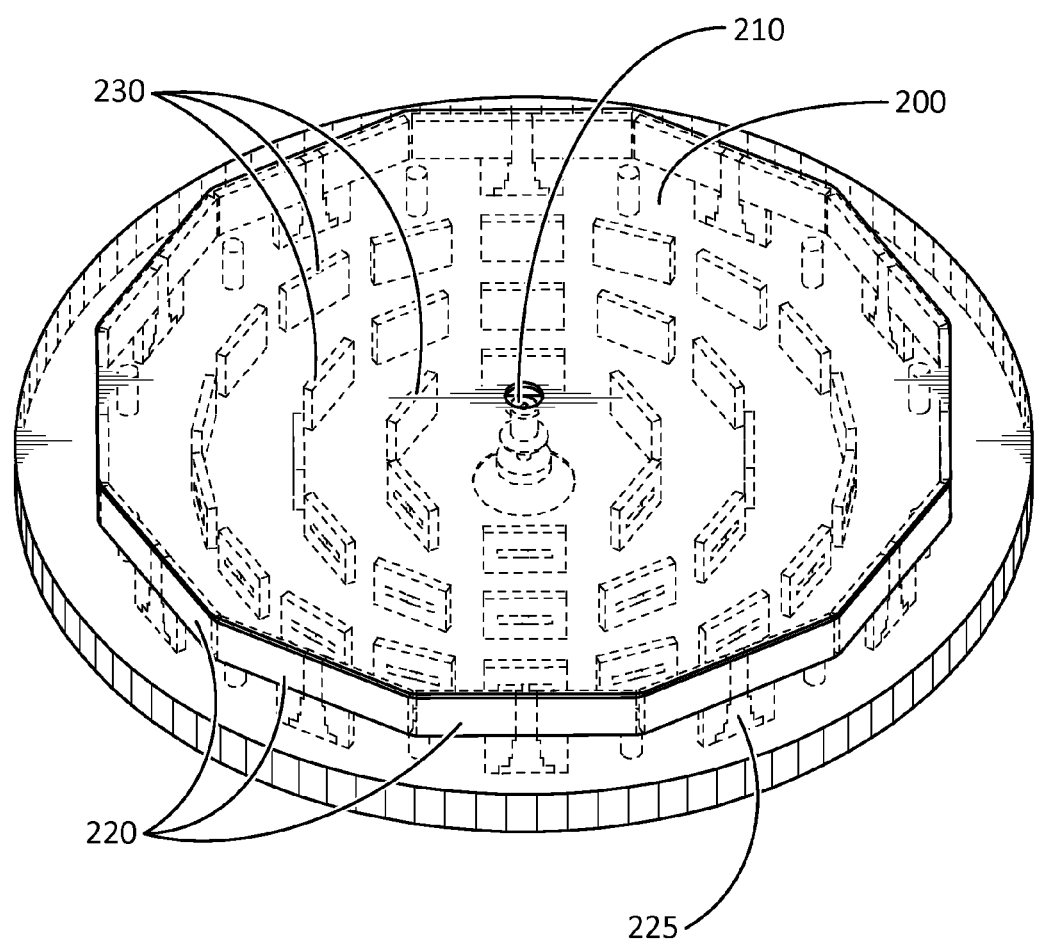
FIG. 2 illustrates an antenna provided in accordance with embodiments of the present invention.

FIG. 2 illustrates an antenna provided in accordance with certain embodiments of the present invention. The antenna includes a radial waveguide 200 having a feed 210 at its center and a plurality of radiating elements 220 around its periphery. The radiating elements 220 may extend from an upper surface of the radial waveguide, for example, and be coupled to the radial waveguide via antenna feeds 225 extending through apertures in the radial waveguide upper surface. In a transmission mode, the feed 210 radiates energy at a predetermined radio frequency, which propagates outward via the waveguide toward the radiating elements. A probe may be coupled to the feed for assisting in appropriate energy radiation. The radiating elements receive this energy via the antenna feeds and in response convert the received energy into a corresponding form of electromagnetic energy appropriate for wireless propagation, that is, propagation beyond the waveguide for reception by a remote radio receiver. Arrayed between the feed 210 and the radial waveguide periphery are a plurality of controllable filter elements 230, also referred to as filter elements or active tuning elements. The filter elements are each responsive to input signals so as to adjust their interaction with the energy between the feed and the radiating elements. Different filter elements may be adjusted differently, for example by controlling filter elements individually or in groups. Each filter element may be controllable so as to block and/or pass certain frequency bands of energy radiating between the feed and certain ones of the radiating elements generally in line with that filter element. Filter elements may be adjusted differently at different times in order to provide a dynamic radiation pattern and/or dynamic frequency configuration corresponding to parts or all of the antenna radiation pattern.

The radiating elements 220 and the filter elements 230 are generally oriented perpendicular to the upper and lower ground plane surfaces of the radial waveguide, and also substantially tangentially with circles concentric with the radial waveguide. The radiating elements 220 may be disposed above or below the radial waveguide while the filter elements 230 are generally disposed between the upper and lower ground plane surfaces of the radial waveguide. In various embodiments, the filter elements 230 may be provided as components on one or more Printed Circuit Boards (PCBs) which are disposed within the radial waveguide. In some embodiments, slots are formed in the waveguide ground planes for accommodating edges of the PCBs. In some embodiments, plural filter elements may be provided on a flexible printed circuit board which is curved to fit within such slots. For example, the filter elements for location around the waveguide feed in a given ring may be provided on one or more flexible PCBs which are arranged into a ring shape and held in place by ring-shaped slots on the upper and lower ground planes. For example, the ring shape can form a substantially closed ring or a segmented ring depending on the configuration of the one or more flexible PCBs used to form the ring shape. Alternatively, a plurality of non-flexible PCBs may be used, each accommodating a given filter element and disposed between the upper and lower ground planes by use of a slot-and-tab configuration, adhesive, or the like. The radiating elements 220 may similarly be provided as components on flexible or non-flexible PCBs to be mounted to an external surface of the radial waveguide. Alternatively, the radial waveguide may be filled with a dielectric material and the filter elements may be embedded within the dielectric material.

In various embodiments, filter elements in a given selectable region may be configured to operate as a bandpass filter for a given frequency band. As such, energy in the given frequency band may pass between the feed and the radiating elements substantially in line with these filter elements, while energy in other frequency ranges, such as adjacent frequency bands, may be blocked.

In various embodiments, filter elements in a given selectable region may be configured to operate as a relatively wideband blocking filter in order to block energy between the feed and the radiating elements substantially in line with these filter elements, over a frequency band of interest. Thus, for example, some radiating elements may be substantially inactivated within an operating frequency band, thereby inhibiting the antenna from radiating in directions corresponding to these elements.

The radiating elements may correspond to antennas, such as dipole antennas, which are capable of an adequately wideband operation to support a given amount of frequency agility of the overall antenna system. Further, the radiating elements may be of relatively high directivity, such that the overall radiation pattern in one or more frequency bands can be adjusted by selective operation of corresponding radiating elements. In various embodiments, as noted above, the radiating elements are disposed perpendicularly to the upper and lower ground planes of the radial waveguide. The radiating elements include a conductive feed path which is configured to feed the RF signal between the radial waveguide and the radiating bodies (such as patch antenna elements) of the radiating elements. The feed path may be routed through an aperture formed in a surface of the radial waveguide and coupled internally to the radial waveguide in an appropriate manner so as to couple the RF signal between the waveguide and the radiating bodies. The general principles of operation of antennas coupled to waveguide transmission media would be readily understood by a worker skilled in the art.

Figure 3:
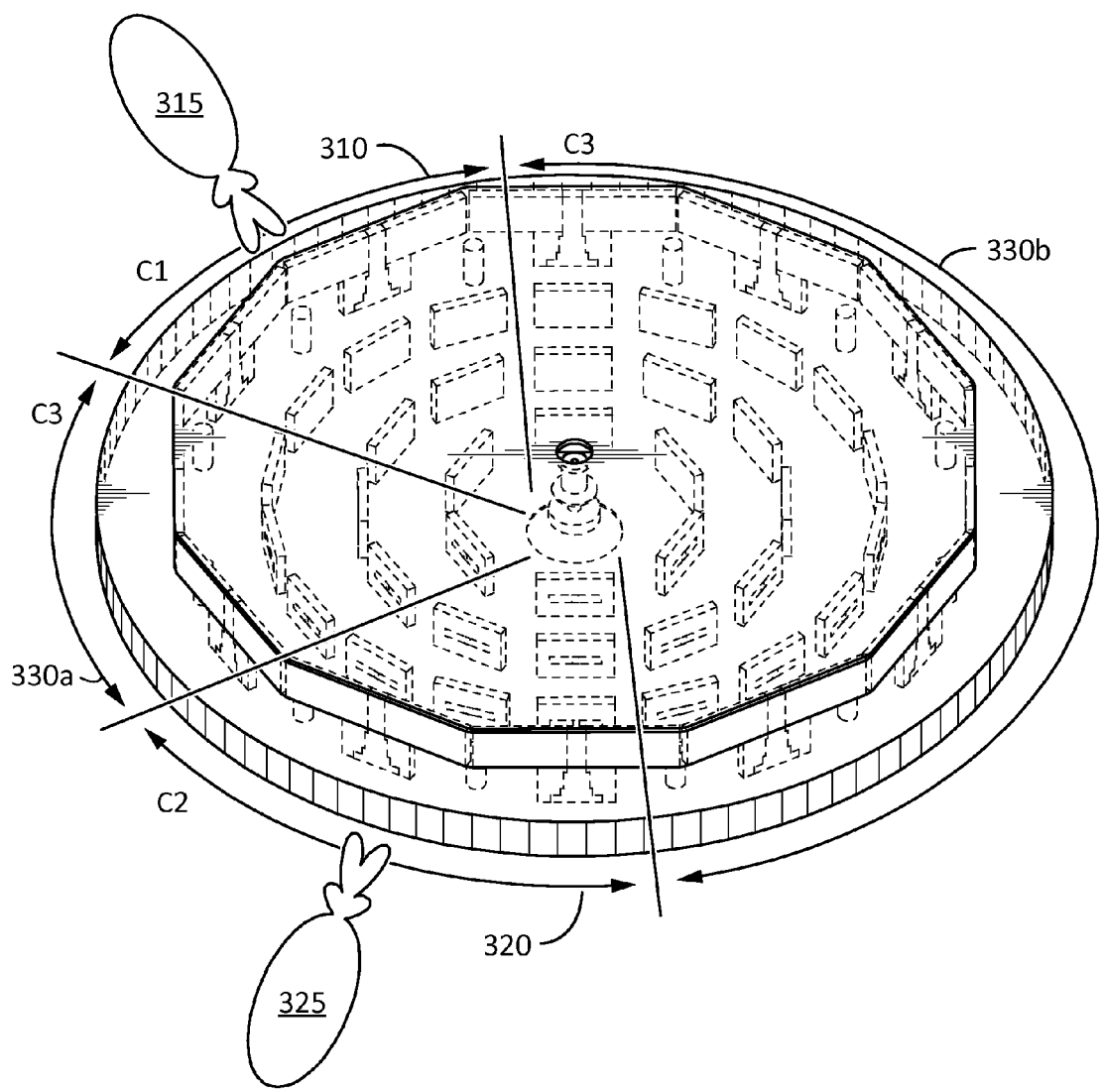
FIG. 3 illustrates directive beam operation of an antenna, in accordance with embodiments of the present invention.

It is noted that different filter elements in different selectable regions may be configured differently, thereby establishing different antenna radiation patterns at desired frequencies in different radial zones around the antenna (for example due to excitation of selected radiating elements at the periphery of such radial zones), to inhibit antenna operation in certain radial zones, or a combination thereof. For example, as illustrated in FIG. 3, a first region 310 may be configured to establish a directive beam antenna radiation pattern 315 operating within a first frequency band, a second, different region 320 may be configured to establish another directive beam antenna radiation pattern 325 operating within a second, different frequency band, and a third region consisting of two separate sub-regions 330a, 330b may be configured to inhibit antenna operation therein. To accomplish this, the filter elements in the first region 310 may be adjusted to exhibit a first capacitance C1 which causes these filter elements to operate as a bandpass filter for passing the first frequency band, while the filter elements in the second region 320 may be adjusted to exhibit a second capacitance C2 which causes these filter elements to operate as a bandpass filter for passing the second frequency band. The filter elements in the third region 330a, 330b may be adjusted to exhibit a third capacitance C3 which causes these filter elements to filter out both the first frequency band and the second frequency band, by establishing appropriate stop bands. The variable capacitances may form part of an inductor/capacitor (LC) or resistance/inductor/capacitor (RLC) resonant filter or series of LC or RLC resonant filters, for example. Thus, in some embodiments, an equivalent discrete-element circuit for the filter elements may include a variable capacitor, an inductor, and a resistor all in parallel with each other. It should be understood that the radiating elements at the antenna periphery are operable in both the first and second frequency bands due for example to wideband nature thereof.

As such, embodiments of the present invention use a single type of component to implement both beamsteering and frequency-based filtering. The component may be dynamically controllable to provide different beamsteering and/or filtering configurations at different times. In contrast, conventional solutions generally require separate frequency filtering and beamsteering components. The resultant agile antenna may be used for example to increase system capacity, power efficiency and to mitigate interference due to controllable beamsteering. Cost and complexity may be reduced, for example by potential elimination of components such as phase shifters, radiofrequency (RF) switches and beamforming network components.

Further, various embodiments of the present invention relate to a radial waveguide antenna incorporating an integrated tunable and directionally-variable bandpass filter. The filter may be configured as a narrowband, multi-pole filter in various embodiments. Embodiments of the present invention may further provide for an electronically controlled frequency tuning and reconfigurable power divider for use in a cylindrical Electromagnetic Band Gap (EBG) structure.

In some embodiments, the filter elements may be adjusted in a time-varying manner, thereby causing time-varying adjustment of the corresponding antenna radiation patterns and/or frequencies. For example, an RF signal supplied via the feed may be in a first frequency band during a first time interval and in a second frequency band during a second time interval. Accordingly, a first set of the filter elements are controlled to pass the first frequency band during the first time interval, and a second set of the filter elements may controlled to pass the second frequency band during the second time interval. The second set of filter elements may be different from, partially different from, or identical to the first set of filter elements. Various coordinated control of the RF signal and the filter elements may be used to effect time-varying production of one beam or two or more concurrent beams of wireless radiation. Time variation may be with respect to frequency, beam direction, beam pattern, or the like, or a combination thereof.

In various embodiments, filter elements are arranged in one, two, three or more concentric rings around the feed. The use of multiple rings of filter elements may facilitate more desirable filter responses, such as sharper filter response characteristics, since this may provide for a filter having a series of resonator components. Filter elements may be operated in groups, for example by similar tuning of all of the filter elements in a selected wedge-shaped region of the radial waveguide.

In various embodiments, the arrangement of filter elements in rings within a radial waveguide provides for a frequency selective surface with a periodic structure. Frequency selective surfaces may include a grid pattern of conductive or otherwise electromagnetically interactive features configured to filter RF signals passing therethrough. The circular topology of the radial waveguide and corresponding ring structure of the filter elements further mitigates the need for consideration of at least some boundary conditions of the frequency selective surface. The filter elements may comprise one of a variety of controllable elements, such as varactors, switches, Microelectromechanical System (MEMS) elements, PIN diodes, or the like. Furthermore, the filter elements in combination with a frequency selective surface within a radial waveguide can provide a tunable and agile power splitter or power combiner. In some embodiments, such a tunable frequency selective surface may be contrasted with a tunable cavity resonator. The tunable frequency selective surface, when combined with antenna radiating elements at the periphery of the radial waveguide, may be utilized for example in provision of the radial waveguide antenna as described herein.

In some embodiments, a variety of different types of filter elements may be incorporated into the antenna. For example, varactor-based filter elements may be used in conjunction with additional filter elements such as PIN diode elements or MEMS elements. Such PIN diode or MEMS elements may be disposed on an interior surface of the radial waveguide structure and selectively activated or deactivated in patterns, via binary control signals, in order to assist in directing propagation of the RF signal over the radial waveguide structure in a manner similar to a power divider. Such additional filter elements may not include controllable frequency filtering characteristics, and indeed may treat frequencies similarly over a wide band, but rather such elements may be configured solely to direct propagation of the RF signal.

For example, PIN diodes may be controllably activated or deactivated by operation of DC switches coupled to a DC current source. The PIN diodes and other types of elements have the ability to change the flow of current over the radial waveguide structure. Whether a given RF signal propagates over PIN diodes in the "ON" mode or in the "OFF" mode may depend on the wavelength of the RF signal. RF chokes may also be coupled to the PIN diode elements or the MEMS elements.

In various embodiments, distances between filter elements may be configured at least in part to provide for a desired amount of element coupling, which in turn affects characteristics of filters corresponding to multiple filter elements operating in a coordinated manner within a given region. Closely spaced rings of filter elements may increase coupling between filter elements in adjacent rings, which in turn may provide for a desired filtering behaviour of the series of filter elements.

In various embodiments, distance between filter elements may be configured at least in part to provide for a desired power distribution of the resultant energy flow between the feed and the radiating elements. For example, by adjusting the filter element spacing, the possible beam widths and beam shapes of filtered energy from the feed may be tuned. Further, in some embodiments, closely spaced rings of filter elements may result in undesired side leakage of RF energy out of a wedge-shaped region of the radial waveguide defined by the presence of similarly tuned filter elements. On the other hand, a far spacing between rings may also result in inadequate capability of the filter elements to direct and/or filter the RF energy. Thus, spacing between filter elements may be optimized for a given set of RF and geometrical conditions. Placement of filter elements, including distance therebetween, may be selected in order to achieve a balance between filtering behaviour and power distribution.

In some embodiments, different filter elements may be individually and fully controllable for example by individual adjustment of control signals provided thereto. In other embodiments, a control circuit may be provided which provides a desired amount of control for example by selection of a plurality of presets. For example, in one embodiment a first control layer may be operative to route a limited number of control signals each to a selectable group of filter elements, for example corresponding to a selected wedge-shaped region of the radial waveguide, so that the selected group of filter elements are operated in a coordinated manner. The first control layer thus provides for the group selection of filter elements in order to facilitate beamsteering control. A second control layer may be operative to adjust the limited number of control signals in order to tune certain filter elements in each group as desired, thereby providing for frequency control of each beam. Using a layered control approach, common control signals may be sent to plural filter elements rather than individual control signals. Control presets may be utilized for further operational simplification. In another embodiment, although the filter elements may be electrically controllable, the control system may be fixed, for example by delivering a fixed set of control signals to the filter elements. As such, a generic antenna may be customized into a permanent or quasi-permanent configuration by application of the fixed control signals. Thus the control system may comprise a simple network of predetermined and static control voltages, for example.

In some embodiments, plural beams, for example two beams or three beams, each beam potentially corresponding to a different frequency band, may be provided. In such embodiments, a control system for the antenna may determine a desired beam configuration for all the beams, either concurrently or sequentially for each beam. For example, a control system may determine a desired direction for a first one of the beams, a desired direction for a second one of the beams, and so on. If the desired direction for two beams overlaps, a variety of solutions may be employed. For example, one beam may take precedence over another based on a predetermined prioritization. As another example, time-based sharing used of the overlapping resources of the antenna may be implemented based on beam switching. As yet another example, the two overlapping beams may be accommodated simultaneously by setting the filter elements to pass a suitably wideband signal, and post-filtering may be employed to separate the two beams based on frequency.

Figure 4:
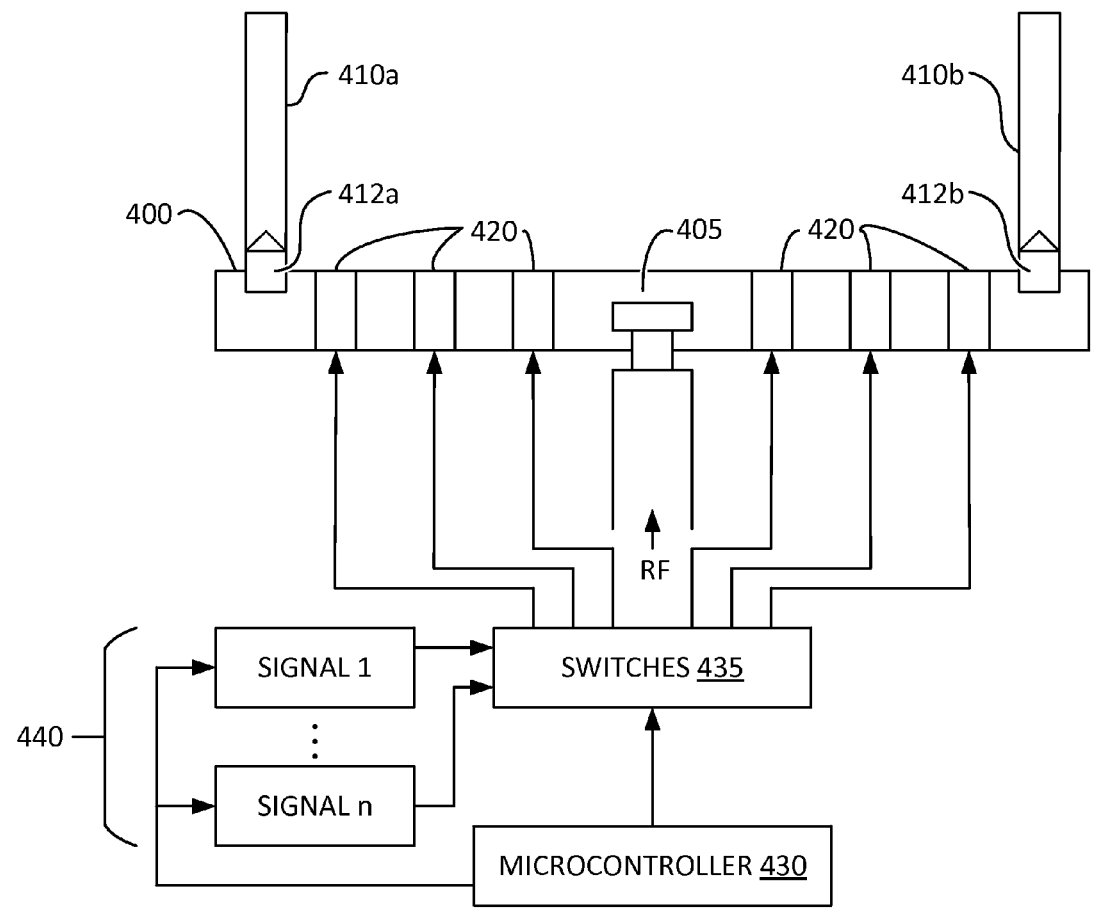
FIG. 4 illustrates a cross-sectional side view of an antenna operatively coupled to a control system, in accordance with embodiments of the present invention.

FIG. 4 illustrates a cross-sectional side view of an antenna operatively coupled to a control system, in accordance with embodiments of the present invention. The antenna includes a radial waveguide 400, a line feed 405 and filter elements 420 disposed within the radial waveguide 400. Radiating elements 410a, 410b protrude upward from a perimeter of the radial waveguide 400, and are coupled to the interior of the waveguide by radiating element feeds 412a, 412b. The line feed 405 protrudes into the center of the radial waveguide 400 and is coupled to an RF signal transmission line which further couples to a source and/or sink for the RF signal. Various alternative approaches for coupling the line feed to the radial waveguide may also be used in some embodiments.

The control system is operatively coupled to the filter elements 420 for control thereof. For example, a multi-level analog voltage signal may be provided to each of the filter elements for adjusting a capacitance or other tuning characteristic thereof. Further, different control signals may be provided to different filter elements. As illustrated, a microcontroller 430 is provided for operating a bank of switches 435 and a plurality of control signal sources 440. The bank of switches 435 is operable to connect a selectable one of the control signal sources 440 to a selectable plurality of the filter elements 420. Thus, a single control signal source may be used to control multiple filter elements. For example, the bank of switches may include one n-way switch for each filter element, the n inputs of the n-way switch connected to the n signal sources. The control signal sources may be controllable voltage or current sources, for example.

Figure 5:
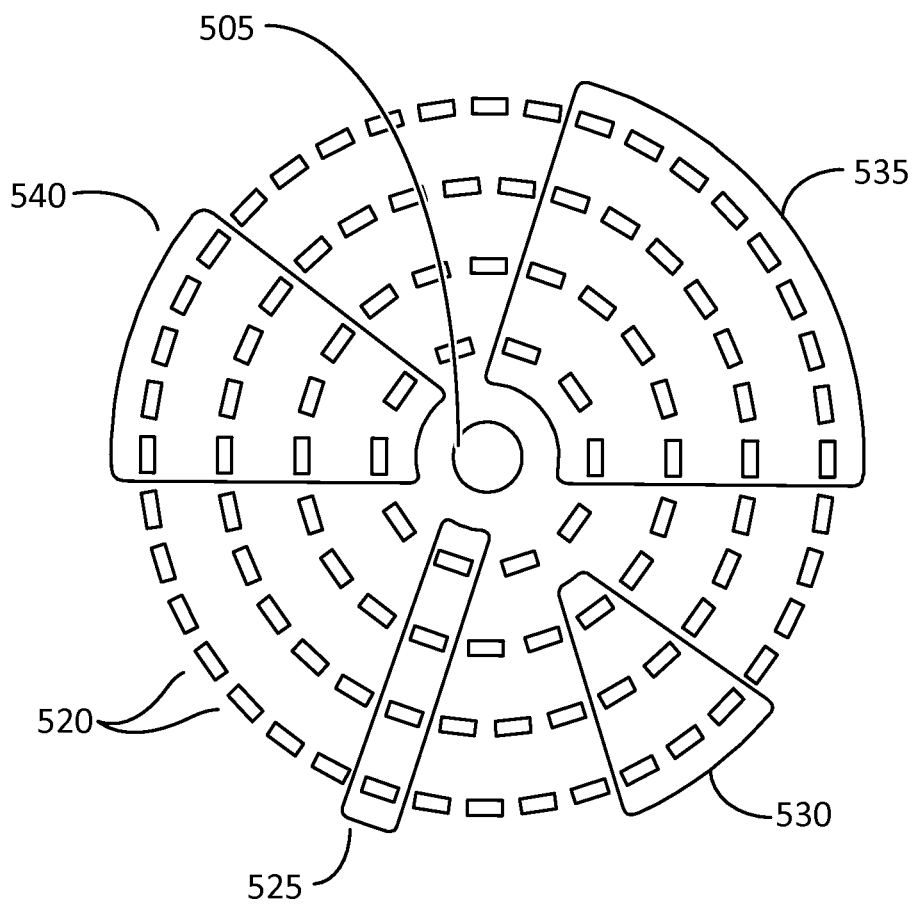
FIG. 5 illustrates a top schematic view of a set of filter elements disposed around a line feed in a radial waveguide, in accordance with an embodiment of the present invention.

FIG. 5 illustrates a top schematic view of a set of filter elements 520 arrayed in four concentric rings around a line feed 505 in a radial waveguide, in accordance with an embodiment of the present invention. Sets of filter elements 520 may be cooperatively configured in various patterns, such as illustrated patterns 525, 530, 535, 540. For example, all of the filter elements in a common set may be driven by a coordinated set of control signals switchably coupled to these filter elements. In one embodiment, filter elements belonging to both the same pattern 525, 530, 535, 540 and to the same concentric ring receive the same control signal. Each pattern 525, 530, 535, 540 may correspond generally to the shape of a desired radiation pattern of wireless energy in a desired frequency band to be emitted by the antenna, or to the shape of a wideband blocking filter, or the like.

In various embodiments, the same antenna may be used for sustaining different communication links, either concurrently, at different times, or both. Reconfiguration of the antenna may be implemented to tailor it for these different communication links. In various embodiments, the antenna may be configured to operate, for a given frequency range, by providing variable radiation patterns. For example, the radiation pattern may be varied in order to increase or decrease directivity.

In some embodiments, RF chokes may be operatively coupled to the filter element control signal lines to block RF frequency leakage along same. This is particularly useful when the control signal lines are exposed to RF signals within the radial waveguide interior.

Figure 6:
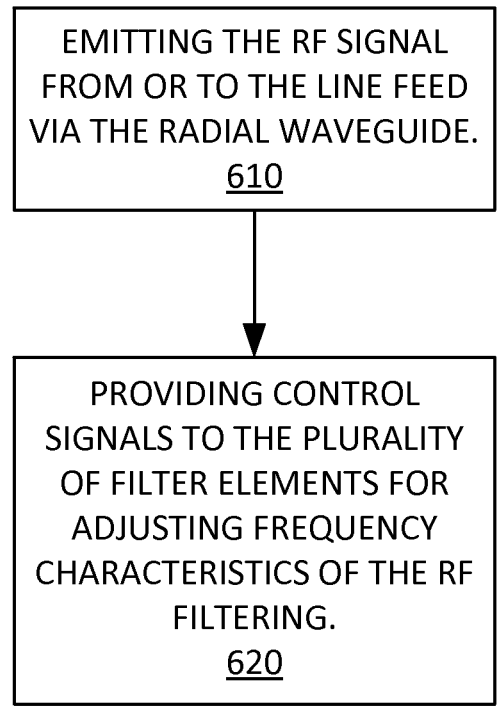
FIG. 6 illustrates a method of antenna operation provided in accordance with embodiments of the present invention.

FIG. 6 illustrates a method for operating an antenna. The antenna has a line feed configured to deliver an RF signal to the antenna, from the antenna, or both. The antenna also has a radial waveguide operatively coupled to the line feed and configured to propagate the RF signal radially outwardly or inwardly from the line feed, to the line feed, or both. A plurality of radiating elements may be disposed around the periphery of the radial waveguide for coupling with the line feed via the RF signal and converting the RF signal to a wireless signal or vice-versa. The method includes emitting the RF signal 610 from or to the line feed via the radial waveguide, depending on whether the antenna is transmitting or receiving the RF signal. According to the method, at least one and in various embodiments a plurality of filter elements are disposed within a cavity of the radial waveguide, interposed radially between the line feed and a periphery of the radial waveguide. Furthermore, each one of the filter elements is controllable to facilitate filtering of the RF signal in its vicinity. The method further includes providing control signals 620 to the filter elements, the control signals for adjusting frequency characteristics of the filtering of the RF signal.

Filter Element

Figure 7A:
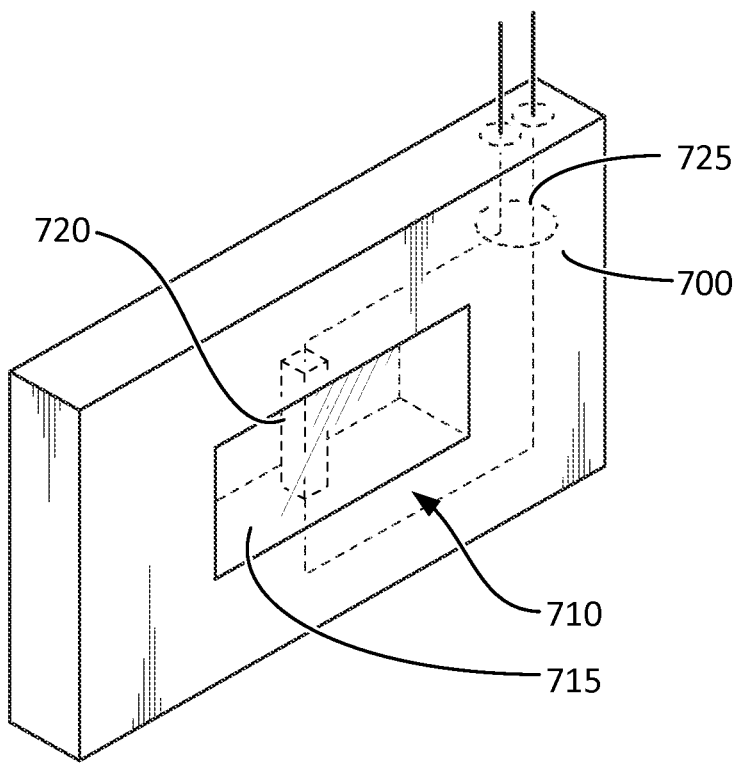
FIG. 7A illustrates filter elements provided in accordance with embodiments of the present invention.

FIG. 7A illustrates a filter element provided in accordance with an embodiment of the present invention. The filter element includes a conductive surface 700, such as a copper layer, surrounding an aperture 710. The aperture includes a substrate 715 and an electrically controllable component 720. One or more internal control signal carriers 725 may be provided for coupling the component 720 to an outside control signal. The component 720 is controllable between a continuum of states or between a plurality of discrete states. Each such state is associated with a different characteristic of the filter element which interacts with the electromagnetic radiation within the radial waveguide. By adjusting the state, the degree of interaction with the electromagnetic radiation can be controlled. Further, the filter elements, either individually, collectively, and/or in conjunction with auxiliary elements, are configured to establish waveguide filters, such as resonant filters, which are adjustable with respect to filtering frequencies by adjusting states of selected components 720.

For example, the component 720 may be a varactor which is controllable to exhibit a variable capacitance. This capacitance interacts with the electromagnetic radiation as part of a resonator filter for filtering same. The resonator filter characteristics may be further associated in part with the size and shape of the aperture 710. It is noted that the aperture sizes and shapes of iris waveguide filters may be varied to adjust characteristics thereof; however conventional iris filters are configured for use in rectangular waveguides rather than as part of a circularly periodic structure within a radial waveguide. Further, conventional iris filters lack a variable capacitance element. Yet further, resonator filter apertures according to embodiments of the invention as described herein are designed based on the use of periodic boundary conditions. As such, the configuration and principle of operation may differ in various ways from that of conventional iris filters.

Figure 7B:
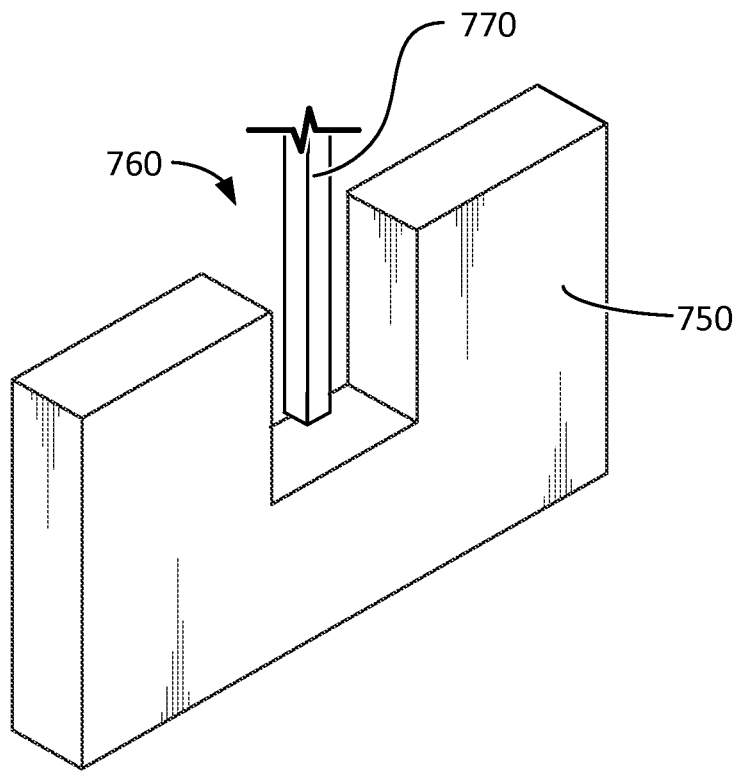
FIG. 7B illustrates filter elements provided in accordance with other embodiments of the present invention.

FIG. 7B illustrates a filter element provided in accordance with another embodiment of the present invention. In this case the filter element comprises a conductive surface 750, such as a copper layer, partially surrounding an aperture 760; however the conductive surface has an open perimeter so that the aperture communicates with an edge of the filter element. The aperture partially houses an electrically controllable component 770, which also extends outside of the aperture. As such, the electrically controllable component 770 may extend to and through a provided hole in the waveguide in order to electrically couple the component 770 to a source of control signal. This eliminates the need for routing of control signals through the filter element to the component. The aperture 770 may include a substrate such as a dielectric.

In various embodiments, filter elements may be operated within a waveguide to establish a frequency selective surface therein. The ring arrangement of filter elements in the radial waveguide may provide for a frequency selective surface periodic structure substantially without side boundary conditions. In some embodiments, a frequency selective surface may comprise one or more semiconductor structures which are controllable, via an electrical control signal, with respect to distribution of their internal electric and/or magnetic fields. Semiconductor structures may correspond to elements such as varactors, for example. Different configurations of such fields may interact differently with RF signals passing therethrough, thereby facilitating adjustment of the frequency selective surface filtering characteristics.

In some embodiments, the filter element may comprise a varactor or other electrically controllable capacitance element. The varactor may be positioned and oriented within the filter element in a manner which desirably interacts with the RF signal for at least a predetermined range of capacitances which may be associated with the varactor.

In some embodiments, the filter element may comprise one or a plurality of switchable components for changing characteristics of the element which are relevant to its filtering effect on incident electromagnetic signals such as those propagated through a waveguide. Such components may include MEMS components or other movable physical components, such as conductive components controlled by a motor or other mechanical actuator, controllable electric or magnetic fields, or the like. The switchable components may further be active, passive or electromechanical components, discrete elements, distributed elements, or the like.

Figure 8:
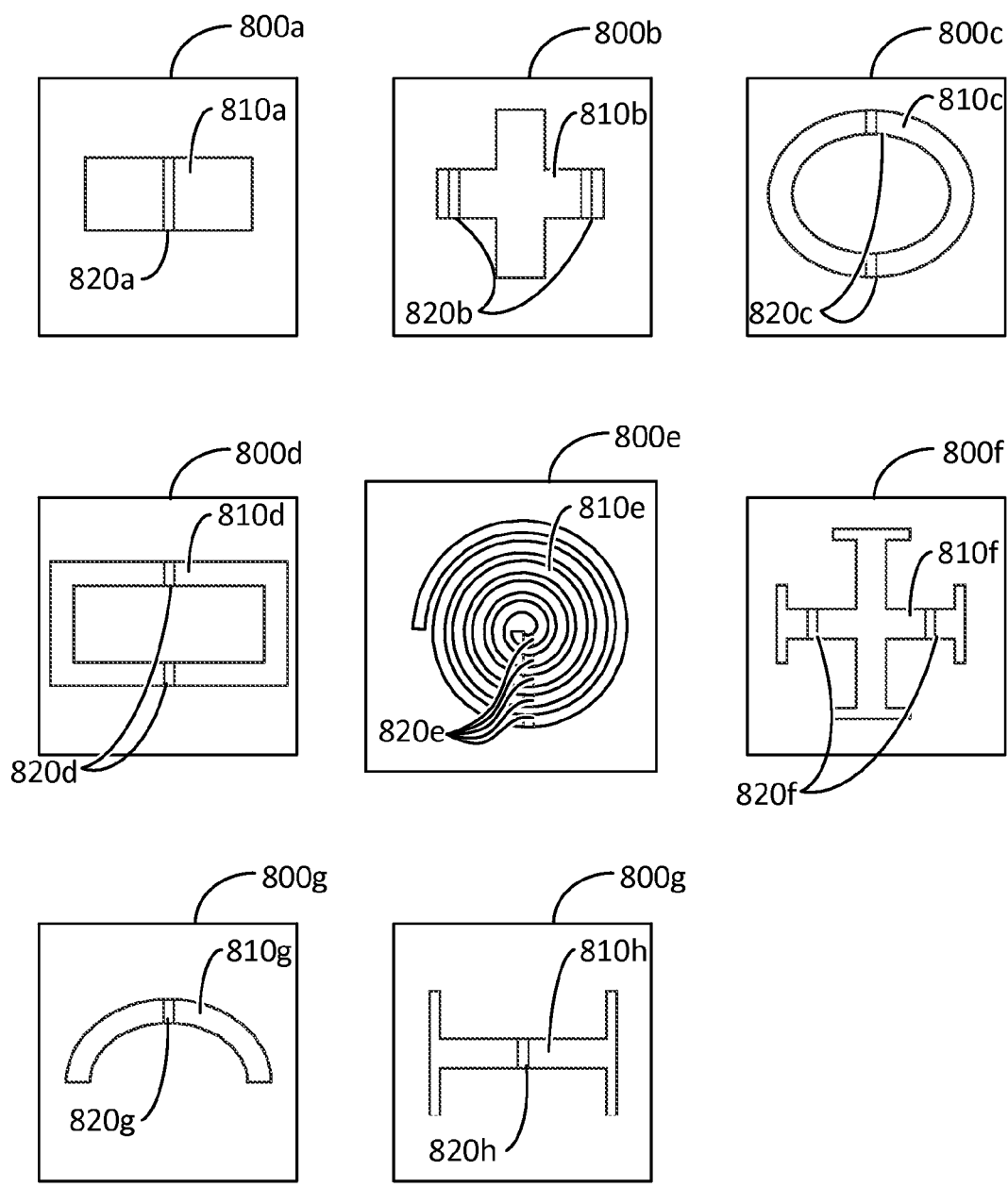
FIG. 8 illustrates various shapes of filter elements that may be provided in accordance with embodiments of the present invention.

FIG. 8 illustrates various shapes of filter elements that may be provided in accordance with embodiments of the present invention. These filter elements may operate as resonator filter elements which are tunable via incorporation of an electrically controllable component such as a varactor. Each element includes a conductive surface 800a to 800h and a particularly shaped aperture 810a to 810h formed therein. The aperture shape may affect the resonant and/or filtering behaviour of the element, for example by adjusting filtering bandwidth, inductive or capacitive characteristics of the element, or the like. The apertures 810a to 810h may include a substrate such as a dielectric material. One or more controllable components may be disposed within the apertures at desired locations. Example placement of such components 820a to 820h is shown, although placement location may be variable.

The invention will now be described with reference to specific examples. It will be understood that the following examples are intended to describe embodiments of the invention and are not intended to limit the invention in any way.

Figure 9A:
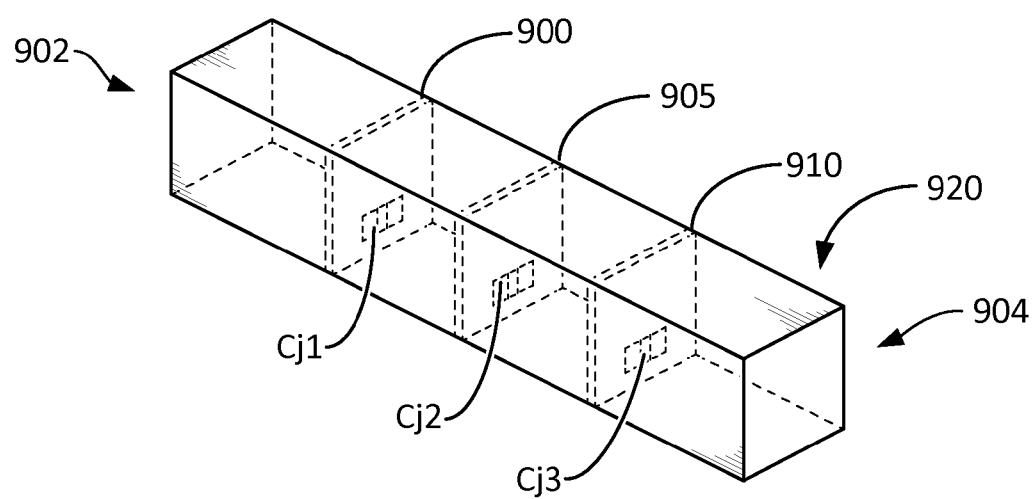
FIG. 9A illustrates a simulated rectangular waveguide tunable filter using filter elements in accordance with an example embodiment of the present invention.

FIG. 9A illustrates a simulation of a rectangular waveguide tunable filter using filter elements 900, 905 and 910, in accordance with an example of the present invention incorporating tunable filter elements. The filter elements 900, 905 and 910 include controllable capacitances $C_{j1}$, $C_{j2}$, $C_{j3}$, respectively. The simulated waveguide 920 includes Perfect Electric Conductor (PEC) boundary conditions on its top and bottom faces, and Floquet boundary conditions on its side faces. Also illustrated are first and second ports 902, 904 at front and back of the waveguide 920, respectively.

Figure 9B:
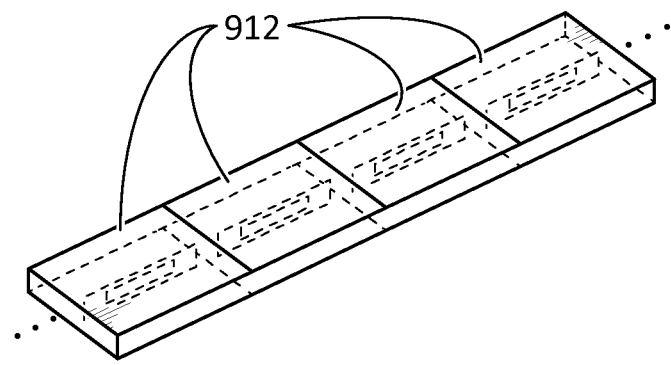
FIG. 9B illustrates a theoretically comparable structure to the simulated rectangular waveguide tunable filter of FIG. 9A.

FIG. 9B illustrates a substantially equivalent theoretical scenario for a single resonator corresponding to one of the filter elements in the arrangement of FIG. 9A, for example due in part to the implementation of Floquet boundary conditions, also called periodic boundary conditions or image boundary conditions. The equivalent scenario corresponds to a filter with infinite repetition of the structure with infinite numbers of filter elements 912 arranged side by side. The electromagnetic energy propagates as a plane wave perpendicularly to the faces of the filter elements. It is understood that this scenario is not practical due to the requirement for infinite space. However it is used here to assist in demonstrating applicability of the example simulation to the ring implementation of filter elements as described elsewhere herein.

Figure 9C:
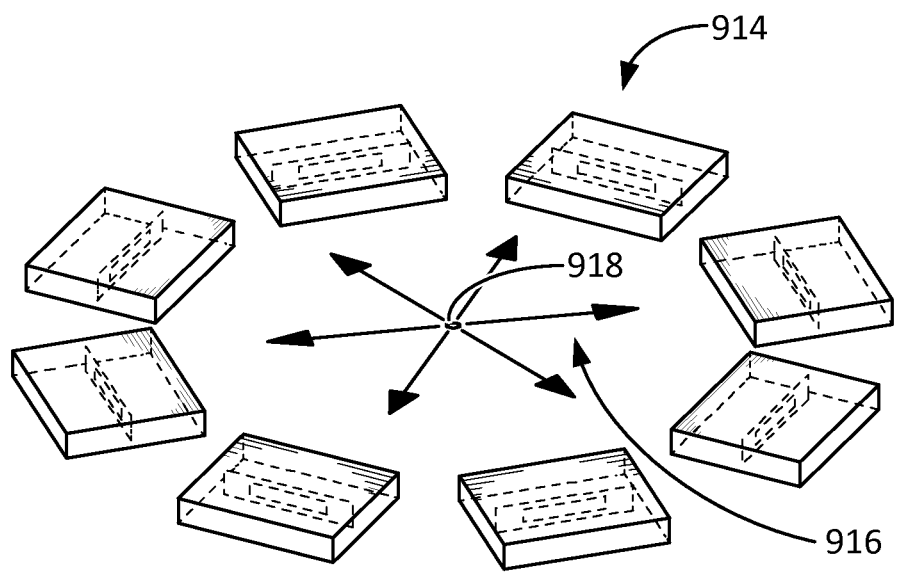
FIG. 9C illustrates a theoretically comparable structure to the simulated rectangular waveguide tunable filter of FIGS. 9A and 9B.

FIG. 9C illustrates a ring-shaped arrangement of filter elements 914 which behaves substantially equivalently to the arrangement of FIG. 9B when the electromagnetic signal 916 propagates radially from a point 918 coincident with the ring's centre. As such, FIG. 9C illustrates a single resonator for a cylindrical wave. Notably, the requirement for an infinite number of filter elements is eliminated in the ring arrangement which achieves a similar periodic boundary condition but with a finite number of elements in a closed circle, thus making the arrangement practical. A topological difference from FIG. 9B is that the electromagnetic signal now propagates radially. As such, the simulation arrangement of FIG. 9A is arguably applicable to various embodiments of the present invention incorporating ring arrangements of filter elements disposed within a radial waveguide.

It is further noted that, to implement three resonators in the ring topology of FIG. 9C, three concentric rings of filter elements may be used. Similarly, to implement three resonators in the planar topology of FIG. 9B three rows of filter elements may be used. More or fewer rows or rings may be used to implement more or fewer resonators. Multiple resonators may be used in order to improve filtering characteristics. For the radial waveguide configuration, multiple rings of resonators may further be configured in various embodiments to adequately distribute the field in different directions.

Figure 9D:
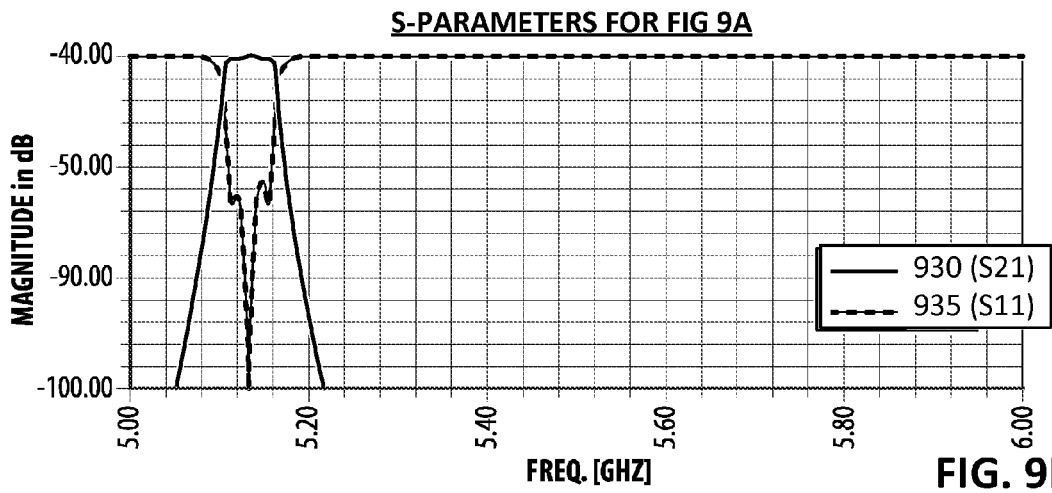
FIG. 9D illustrates frequency response curves for a first set of tuning values of the filter elements of FIG. 9A.
Figure 9E:
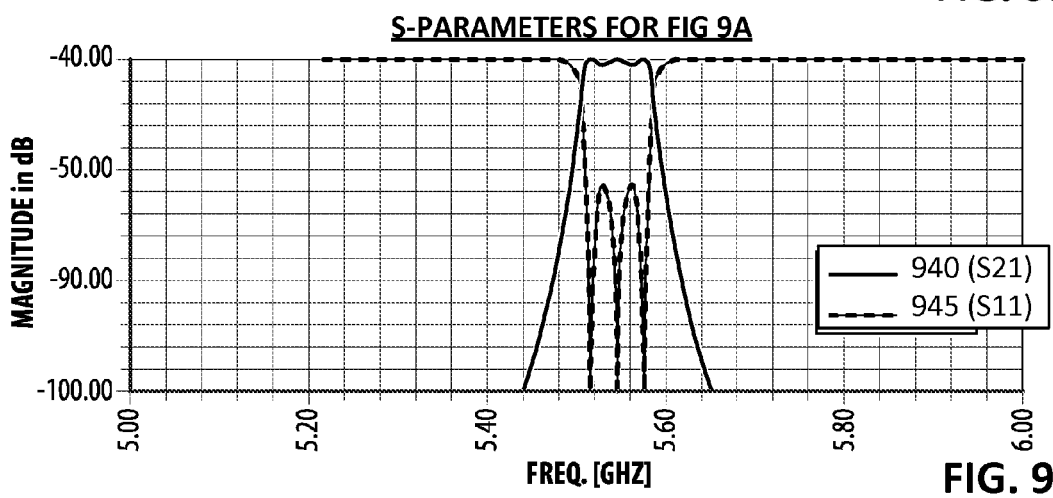
FIG. 9E illustrates frequency response curves for a second set of tuning values of the filter elements of FIG. 9A.
Figure 9F:
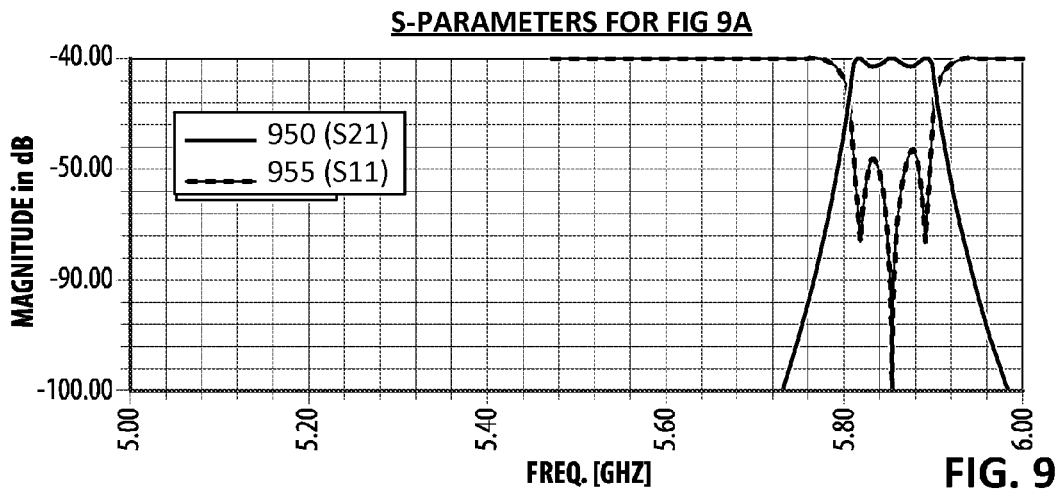
FIG. 9F illustrates frequency response curves for a third set of tuning values of the filter elements of FIG. 9A.

FIGS. 9D to 9F illustrate plots of filter behaviours for the filter element illustrated in FIG. 9A for various values of the capacitances $C_{j1}$, $C_{j2}$, $C_{j3}$. For FIG. 9D, the capacitance values are set at $C_{j1}$=0.53 pF, $C_{j2}$=0.64 pF and $C_{j3}$=0.53 pF, and the filter center frequency is at about 5.1375 GHz. For FIG. 9E, the capacitance values are set at $C_{j1}$=0.45 pF, $C_{j2}$=0.55 pF and $C_{j3}$=0.45 pF, and the filter center frequency is at about 5.548 GHz. For FIG. 9F, the capacitance values are set at $C_{j1}$=0.40 pF, $C_{j2}$=0.49 pF and $C_{j3}$=0.40 pF, and the filter center frequency is at about 5.8945 GHz. The curves 930, 940, 950 in FIGS. 9D to 9F which transition from low to high and back to low correspond to the transmission coefficient S-parameter S21 (in dB) for the first and second ports 902, 904 at front and back of the waveguide 920, respectively. The curves 935, 945, 955 in FIGS. 9D to 9F which transition from high to low and back to high correspond to the reflection coefficient S-parameter S11 (in dB) for the first port at front of the waveguide 920.

Figure 10A:
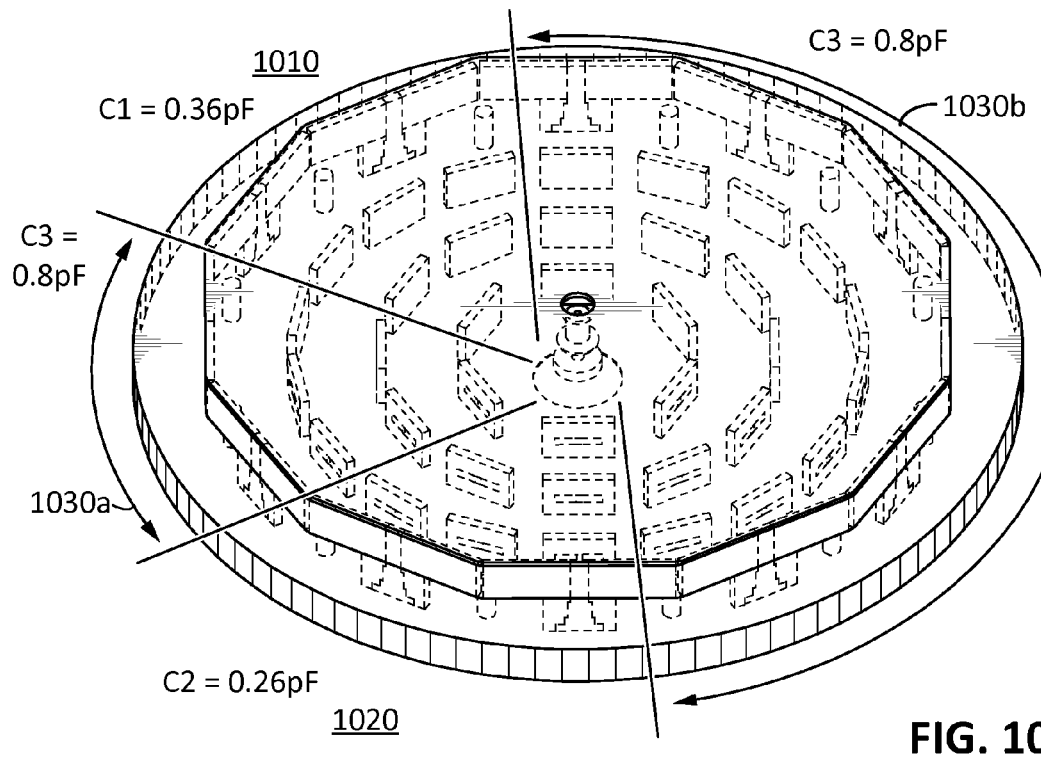
FIG. 10A illustrates a power divider configuration and state for a waveguide antenna provided in accordance with an example embodiment of the present invention.

FIG. 10A illustrates a power divider configuration with 12 output ports and state for a reconfigurable antenna provided in accordance with an example embodiment of the present invention. Capacitances of filter elements within a first region 1010 are set at $C_1$=0.36 pF, capacitances of filter elements within a second region 1020 are set at $C_2$=0.26 pF, and capacitances of filter elements within a third region consisting of sub-regions 1030a and 1030b are set at $C_3$=0.8 pF.

Figure 10B:
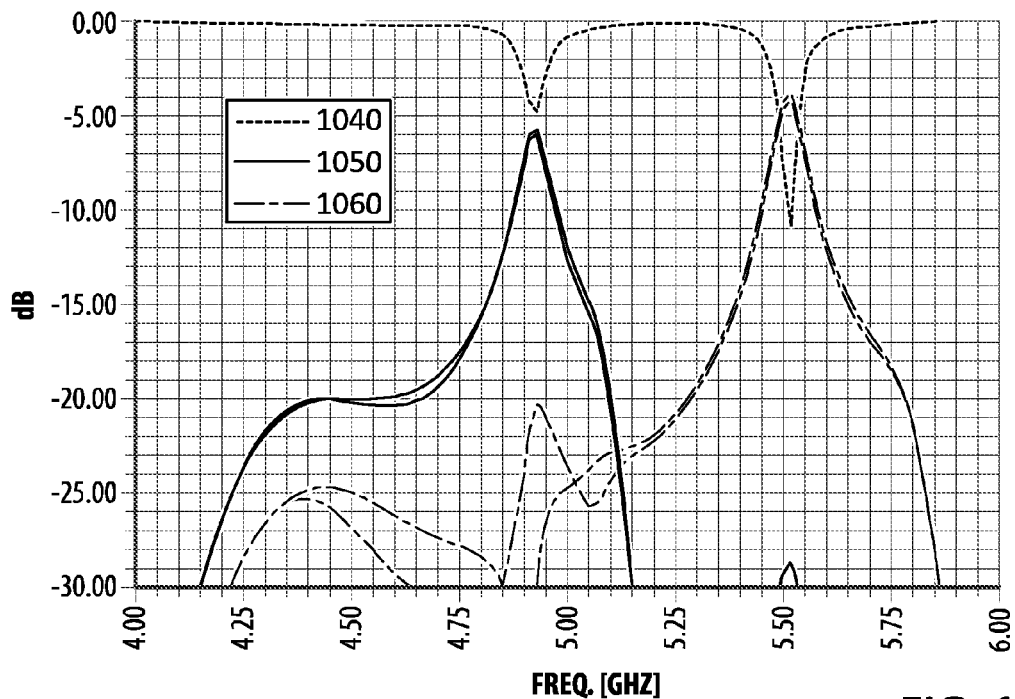
FIG. 10B illustrates frequency response curves for the waveguide antenna of FIG. 10A.

FIG. 10B illustrates the S11 value 1040 (the ratio of signal that reflects from port one for a signal incident on port one) and signal transmission to coupled ports as a function of frequency. Curve 1050 relates to the return loss and transmission coefficients to coupled ports vs. frequency for the first region 1010, while curve 1060 relates to the return loss and transmission coefficients to coupled ports vs. frequency for the second region 1020. Frequencies in the illustrated range are substantially blocked from transmission in the third region 1030a, 1030b due to the high capacitance value. As can be seen, the first region 1010 passes RF signal in a first frequency band with a peak at about 4.925 GHz and the first region passes RF signal in a second frequency band with a peak at about 5.525 GHz. Port 1 of FIGS. 10A and 10B correspond to the central line feed, while the 12 output ports correspond to the antenna coupling ports.

Although the present invention has been described with reference to specific features and embodiments thereof, it is evident that various modifications and combinations can be made thereto without departing from the invention. The specification and drawings are, accordingly, to be regarded simply as an illustration of the invention as defined by the appended claims, and are contemplated to cover any and all modifications, variations, combinations or equivalents that fall within the scope of the present invention.

We claim:

1. An antenna comprising:
    a line feed configured to deliver a radiofrequency (RF) signal;
    a radial waveguide operatively coupled to the line feed and configured to propagate the RF signal radially with respect to the line feed, the radial waveguide having a pair of parallel conductive surfaces defining a cavity therebetween; and
    one or more filter elements disposed within the cavity of the radial waveguide and interposed radially between the line feed and a periphery of the radial waveguide, wherein each of the filter elements is controllable to facilitate filtering of the RF signal in a vicinity of said filter element, and wherein frequency characteristics of said filtering of the RF signal are adjustable in accordance with control signals provided to the one or more filter elements.

2. The antenna according to claim 1, further comprising a plurality of radiating elements disposed around the periphery of the radial waveguide, the radiating elements configured to convert the RF signal for wireless propagation beyond the waveguide.

3. The antenna according to claim 1, wherein the RF signal comprises a first signal component in a first frequency band and a second signal component in a second frequency band.

4. The antenna according to claim 3, wherein a first set of the filter elements within a first area of the waveguide are controlled to pass the first frequency band.

5. The antenna according to claim 4, wherein a second set of the filter elements within a second area of the waveguide are controlled to pass the second frequency band.

6. The antenna according to claim 4, wherein the first area is controllable by selection of the first set of the filter elements, thereby directing the first signal component in a desired direction.

7. The antenna according to claim 1, wherein the RF signal is in a first frequency band during a first time interval and in a second frequency band during a second time interval, and wherein a first set of the filter elements are controlled to pass the first frequency band during the first time interval and a second set of the filter elements are controlled to pass the second frequency band during the second time interval.

8. The antenna according to claim 1, wherein the filter elements are arranged in one or more circles concentric with the line feed.

9. The antenna according to claim 1, wherein each of the filter elements comprises a conductive housing configured to have an aperture defined therein, and a controllable varactor positioned within the aperture.

10. The antenna according to claim 1, further comprising additional filter elements different from the one or more filter elements.

11. The antenna according to claim 10, wherein the additional filter elements are configured solely to direct propagation of the RF signal.

12. The antenna according to claim 1, wherein at least one of the filter elements is adjustable between at least three states based on said control signals, each of the at least three states corresponding to different characteristics of said filtering of the RF signal in the vicinity of the at least one of the filter elements.

13. The antenna according to claim 1, wherein at least one of the filter elements comprises:
a surface having an aperture formed therein; and
a controllable element disposed at least partially within the aperture, said controllable element electrically controllable to adjust an electrical impedance characteristic of the at least one of the filter elements, thereby adjusting a filtering effect of the filter element upon the RF signal,
wherein the at least one of the filter elements is oriented across a direction of propagation of the RF signal.

14. The antenna according to claim 13, wherein the surface of the filter element is an electrically conductive surface.

15. The antenna according to claim 13, wherein the controllable element comprises a semiconductor structure, the filter element further comprising a control signal carrier operatively coupled to the semiconductor structure to adjust the electrical impedance characteristic of the filter element.

16. The antenna according to claim 13, wherein the controllable element comprises a varactor.

17. The antenna according to claim 13, wherein the controllable element comprises a MEMS component, a controllable capacitance, a controllable electric field, a mechanically movable component, or a controllable magnetic field.

18. A method for operating an antenna, the method comprising:
emitting a radiofrequency (RF) signal from or to a line feed, the RF signal further propagated via a radial waveguide, wherein the antenna comprises the line feed and the radial waveguide operatively coupled to the line feed, the radial waveguide having a pair of parallel conductive surfaces defining a cavity therebetween, wherein the line feed is configured to deliver the RF signal and the radial waveguide is configured to propagate the RF signal radially with respect to the line feed, and wherein one or more filter elements are disposed within the cavity of the radial waveguide and interposed radially between the line feed and a periphery of the radial waveguide, and wherein each of the filter elements is controllable to facilitate filtering of the RF signal in a vicinity of said filter element; and
providing control signals to the one or more filter elements for adjusting frequency characteristics of said filtering of the RF signal.

19. The method according to claim 18, wherein the control signals comprise first control signals and second control signals, wherein the first control signals control a first set of filter elements and wherein the second control signals control a second set of filter elements, the second set of filter elements different from the first set of filter elements.

20. The method according to claim 19, wherein the first control signals and the second control signals are provided in a time-varying manner.

21. The method according to claim 19, wherein the first control signals control the first set of filter elements to pass a first frequency band during a first time interval and the second control signals control the second set of filter elements to pass the second frequency band during a second time interval.

22. The method according to claim 18, wherein at least one of the filter elements is adjustable between at least three states based on said control signals, each of the at least three states corresponding to different characteristics of said filtering of the RF signal in the vicinity of the at least one of the filter elements.

23. The method according to claim 18, wherein at least one of the filter elements comprises a conductive housing configured to have an aperture defined therein, and a controllable varactor positioned within the aperture.

* * * * *